United States Patent [19]

Buhr et al.

[11] 4,311,782
[45] Jan. 19, 1982

[54] RADIATION-SENSITIVE MIXTURE AND PROCESS FOR THE PRODUCTION OF RELIEF IMAGES

[75] Inventors: Gerhard Buhr, Königstein; Hans Ruckert, Wiesbaden, both of Fed. Rep. of Germany

[73] Assignee: Hoechst Aktiengesellschaft, Fed. Rep. of Germany

[21] Appl. No.: 169,133

[22] Filed: Jul. 15, 1980

[30] Foreign Application Priority Data

Jul. 16, 1979 [DE] Fed. Rep. of Germany ....... 2928636

[51] Int. Cl.³ ............................ G03C 1/68; G03C 5/00
[52] U.S. Cl. ............................... 430/270; 430/271; 430/278; 430/300; 430/322; 430/306; 204/159.14
[58] Field of Search .............. 430/270, 271, 300, 278, 430/306, 322; 204/159.14

[56] References Cited

U.S. PATENT DOCUMENTS

| | | | |
|---|---|---|---|
| 4,066,747 | 1/1978 | Capozza | 528/403 |
| 4,101,323 | 7/1978 | Buhr et al. | 430/270 |
| 4,119,579 | 10/1978 | Capozza | 528/403 |

Primary Examiner—Jack P. Brammer
Attorney, Agent, or Firm—James E. Bryan

[57] ABSTRACT

A radiation-sensitive mixture is described which contains (a) a compound which forms an acid under the action of actinic radiation, and (b) a polymeric compound having recurrent orthocarboxylic acid ester groupings, and which comprises a polymeric compound which is built up from recurrent units of the formula I:

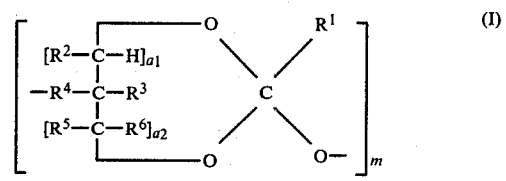

wherein $R^1$ is a hydrogen atom or an alkyl, cycloalkyl or aryl group, $R^2$, $R^3$ and $R^5$ are identical or different and denote hydrogen atoms or alkyl or aryl groups, $R^4$ denotes an alkylene group or —if $a_1 = a_2 = 1$— also an alkyleneoxy group, it being possible for the alkylene groups to be interrupted by hetero-atoms or by unsaturated or cyclic groups, $R^6$ denotes a hydrogen atom or a methyl group, $a_1$ and $a_2$ each denote, 0, 1 or 2, $a_1 + a_2$ denotes 1 or 2 and m denotes a number from 3 to 200. The mixtures are suitable for the production of reprographic materials, in particular printing plates, of high photosensitivity.

7 Claims, No Drawings

RADIATION-SENSITIVE MIXTURE AND PROCESS FOR THE PRODUCTION OF RELIEF IMAGES

The present invention relates to a new radiation-sensitive mixture which contains, as the essential constituents, (a) a compound which forms an acid under the action of actinic radiation, and (b) a polymeric compound having recurrent orthocarboxylic acid ester groupings, which can be split by acid, in the main chain, the solubility of the compound (b) in a liquid developer being increased by the action of acid.

Positive-working photosensitive resist materials, i.e., materials, the photosensitive layer of which becomes soluble in the exposed areas, are known. Above all, positive-working resist materials based on o-quinonediazides have gained acceptance in practice.

The photosensitivity of these resist materials is frequently unsatisfactory. An increase in the photosensitivity can be obtained by the use of catalytically active photosensitive systems because, in this case, the quantum yield becomes greater than 1. Thus, the known principle of initiating secondary reactions by photolytically produced acids and hence making the exposed areas soluble, has been utilized recently for positive-working systems. In this case, photochemically produced strong acids serve for the splitting of special low-molecular and high-molecular acetals and O,N-acetals, which contain aromatic compounds as the hydroxyl or amine components (U.S. Pat. No. 3,779,778), and of ortho-esters and amide-acetals (German Auslegeschrift No. 2,610,842).

The combination of photochemical acid-formers with certain polyaldehydes and polyketones also has been described as a positive-working resist material which on exposure gives visible images (U.S. Pat. Nos. 3,915,704, 3,915,706, 3,917,483, 3,932,514, and 2,892,712).

In addition, German Offenlegungsschrift No. 2,718,254 describes a radiation-sensitive mixture which consists of certain aliphatic polyacetals or polyketals and photolytic acid donors and which is likewise positive-working.

These substance mixtures are, however, not free from disadvantages. Polyaldehydes and polyketones which, as the essential constituents, determine the quality of the corresponding recording materials, can be varied only to a limited extent in their material properties and adapted to the requirements in practice.

In spite of the catalytic mode of action, the resist materials which contain the above-mentioned acetals and O,N-acetals do not possess a satisfactory photosensitivity in practice. Moreover, many of these compounds are not readily accessible.

Although the polyacetals or polyketals of German Offenlegungsschrift No. 2,718,254 can be readily matched to many technical applications by varying their structure, they do not in general reach the highest practical photosensitivities, such as can be achieved with aliphatic ortho-esters, in resist materials. Within this class of substances, in turn, there is a demand for compounds which have an increased stability in reproduction materials and photoresist solutions.

It is the object of the invention to provide a new positive-working, radiation-sensitive mixture which possesses a very high sensitivity for actinic radiation, in particular short-wavelength light and electron radiation and the constituents of which are readily accessible and, in this mixture, show a longer storage life than comparable known mixtures.

The starting point of the invention is a radiation-sensitive mixture which contains, as the essential constituents, (a) a compound which forms an acid under the action of actinic radiation, and (b) a polymeric compound having recurrent orthocarboxylic acid ester groupings, which can be split by acid, in the main chain, the solubility of the compound (b) in a liquid developer being increased by the action of acid.

The mixture according to the invention comprises a polymeric compound which has recurrent ortho-carboxylic acid ester groupings, which can be split by acid, and is built up from recurrent units of the general formula (I):

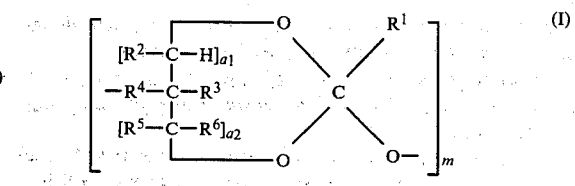

wherein $R^1$ is a hydrogen atom or an alkyl, cycloalkyl or aryl group, $R^2$, $R^3$ and $R^5$ are identical or different and denote hydrogen atoms or alkyl or aryl groups, $R^4$ denotes an alkylene group or —if $a_1=a_2=1$—also an alkyleneoxy group, it being possible for the alkylene groups to be interrupted by hetero-atoms or by unsaturated or cyclic groups, $R^6$ denotes a hydrogen atom or a methyl group, $a_1$ and $a_2$ each denote 0, 1, or 2, $a_1+a_2$ denotes 1 or 2 and m denotes a number from 3 to 200.

Within the scope of this description, actinic radiation is to be understood as any radiation, the energy of which corresponds at least to that of short-wavelength visible light. Long-wavelength UV radiation and also electron radiation, X-ray radiation and laser radiation are particularly suitable.

Liquid developers are to be understood in particular as aqueous solutions, preferably weakly alkaline solutions, and also organic solvents, if appropriate in mixture with water or aqueous solutions.

In the formula I, the symbols can have the following meaning in detail:

$R^1$ is, for example, hydrogen or a branched or straightchain alkyl group which has 1–6 carbon atoms and which can be substituted by halogen atoms, alkoxy groups, acyl groups or phenyl groups and can contain olefinic double bonds. Preferably, $R^1$ is H, methyl, ethyl, cyclohexyl or phenyl, and in particular H.

$R^2$, $R^3$ and $R^5$ preferably are hydrogen atoms, straightchain or branched alkyl groups which have 1–12, in particular 1–6, carbon atoms and which are unsubstituted or substituted, for example, by halogen atoms, alkoxy groups having 1–14 carbon atoms, wherein individual methylene groups can be replaced by oxygen atoms, by alkenyloxy groups having 3–12 carbon atoms, optionally substituted 5-membered or 6-membered cycloalkyloxy or cycloalkenyloxy groups, optionally substituted phenoxy groups, by benzyloxy groups, alkylmercapto groups having 1–12 carbon atoms, phenylmercapto groups, cycloalkyl or cycloalkenyl groups or optionally substituted phenyl groups, or are optionally substituted cycloalkyl or cycloalkenyl groups, preferably having 5 or 6 ring carbon atoms, or also optionally substituted phenyl groups.

Those compounds are preferred in which not more than two, in particular not more than one, of the groups $R^2$, $R^3$ and $R^5$ are other than hydrogen.

If $R^4$ is an alkylene group, this preferably has up to 14, particularly preferably 2–12, carbon atoms, among which individual carbon atoms can be replaced by oxygen or sulfur atoms, phenylene groups, cycloalkylene groups, carbonyl groups, alkenylene groups or ethynylene groups.

The alkylene group $R^4$ also can be substituted, for example, by alkyl groups having 1–8 carbon atoms, alkenyl groups having 2–8 carbon atoms, alkoxy groups, halogen atoms, cycloalkyl or cycloalkenyl groups or optionally substituted phenyl or phenoxy groups.

The same applies to the case where $R^4$ is an alkyleneoxy group. $R^6$ preferably is a hydrogen atom.

Compounds with $a_1+a_2=2$, in particular those with $a_1=a_2=1$, are preferred. The number m preferably has a value from 5 to 150.

Some of the polymeric ortho-esters according to the present invention are known from German Offenlegungsschrift No. 2,715,502. In the latter, they are described as suitable for use as degradable coatings for active ingredients, for example medicaments.

The compounds, used according to the invention, having recurrent 2-oxy-1,3-dioxolan or 2-oxy-1,3-dioxane units, can be prepared by a condensation reaction of suitable trihydroxy compounds with lower ortho-carboxylic acid esters.

Suitable trihydroxy compounds have two hydroxyl groups in α,β-position or α,γ-position, and the third hydroxyl group is in a position which favors the intermolecular condensation reaction compared with an intramolecular reaction which leads to monomeric bicyclo compounds. Thus, for example, a dual 1,3-relationship is less suitable because trioxabicyclooctanes are readily formed in that case.

Examples of suitable triols are: glycerol, butane-1,2,4-triol, 2-hydroxymethyl-butane-1,4-diol, pentane-1,2,5-triol, 2-hydroxymethyl-pentane-1,5-diol, hexane-1,2,5-triol, 2-hydroxymethyl-hexane-1,6-diol, hexane-1,2,6-triol, 4-ethyl-hexane-1,4,5-triol, heptane-1,4,5-triol, 1-(1,2-dihydroxyethyl)-4-hydroxymethylbenzene, 2,4,6-triethyl-5-propyl-heptane-1,3,7-triol, 1-(2,3-dihydroxypropoxy)-4-hydroxymethyl-benzene, 1-(2,3-dihydroxypropyl)-4-hydroxymethyl-benzene, oct-3-ene-1,7,8-triol, octane-1,2,8-triol, octane-1,3,8-triol, nonane-1,4,5-triol, 3-(1-hydroxy-1-methyl-ethyl)-5-oxa-octane-2,8-diol, 2,6,8-trimethyl-3-hydroxymethyl-nonane-6,7-diol, 2-hydroxymethyl-3-oxa-heptane-1,7-diol and hexadecane-1,2,16-triol.

Examples of ortho-esters, which have identical or mixed lower ester alkyl groups and which can be employed for the synthesis of the polymers according to the invention, are trimethyl, triethyl, tri-n-butyl, methyl diethyl and ethyl di-isopropyl ortho-formate, trimethyl and triethyl ortho-acetate, trimethyl, triethyl and tri-n-butyl ortho-propionate, trimethyl ortho-cyclohexanoate, trimethyl, triethyl and tri-n-propyl ortho-benzoate, 1,1,1-trimethoxy-prop-2-ene and trimethyl ortho-chloroacetate; preferably, the trimethyl and triethyl esters are used.

The condensation can be carried out without a solvent by mixing the components in a molar ratio of 1:1, preferably in the presence of an acid catalyst, such as toluene sulfonic acid, sulfuric acid or of an acid ion exchanger, at reaction temperatures from 60° to 170°, preferably 70°–130° C., if appropriate under reduced pressure. The lower alcohols liberated are then continuously removed from the reaction mixture.

To regulate the molecular weight or in order to influence the end groups of the polymers, it is possible, if appropriate, to deviate from the ideal molar ratio of 1:1.

Advantageously, however, the polycondensation reaction also can be carried out in the presence of a solvent which does not irreversibly react under the reaction conditions, such as toluene, xylene, dioxane or chlorinated hydrocarbons, the lower alcohol liberated being distilled off, if appropriate together with a part of the solvent, in the course of the reaction.

Compounds of the formula I, wherein $a_1=a_2=1$, $R^2=R^5=R^6=H$ and $R^4$ denotes an alkyleneoxymethyl group $R^7$—O—$CH_2$, are particularly preferred. These are polymeric compounds having recurrent units of the formula II

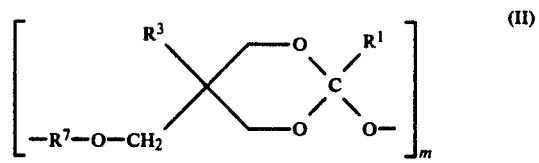

wherein $R^1$ and m have the meaning indicated under the formula I, $R^3$ denotes H, a saturated or unsaturated, straight-chain or branched aliphatic group which has 1 to 6 carbon atoms and which can be substituted, for example, by halogen atoms, preferably chlorine or bromine, alkoxy groups having 1 to 10 carbon atoms, wherein individual methylene groups can be replaced by oxygen atoms, by alkenyloxy groups, optionally substituted phenoxy, benzyloxy or cycloalkoxy, preferably cyclohexoxy, or alkylmercapto groups having 1 to 6 carbon atoms, optionally substituted phenyl or benzylmercapto groups or optionally substituted phenyl groups, or denotes an optionally substituted phenyl group or a 5-membered or 6-membered cycloalkyl or cycloalkenyl group, and $R^7$ represents an optionally substituted alkylene group which has 2 to 12 carbon atoms and in which individual methylene groups can be replaced by oxygen, sulfur, phenylene groups or alkenylene, alkynylene or cyclohexylene groups.

The substituents of the alkylene group $R^7$ can, for example, be: alkyl groups having 1 to 8 carbon atoms, alkenyl groups having 2 to 8 carbon atoms, alkoxy groups, halogen atoms, cycloalkyl or cycloalkenyl groups or optionally substituted phenyl or phenoxy groups.

The triols on which the polymer units of the formula II are based can be readily prepared by converting trimethylolmethanes substituted by $R^3$ in a known manner into 3-hydroxymethyloxetanes which are substituted in the 3-position by $R^3$, and splitting the oxetane ring with an excess of the diol HO-$R^7$-OH in the presence of acid catalysts. One of the original hydroxymethyl groups is thus converted into an etherified hydroxymethyl group.

$R^3$ can, for example, denote hydrogen, methyl, ethyl, propyl, cyclohexyl, cyclohexenyl, phenyl, chloromethyl, bromomethyl, vinyl, phenoxymethyl, isopropyl, phenyl-mercaptomethyl, methoxymethyl, ethoxymethyl, allyloxy-methyl and 2-ethoxy-ethoxymethyl.

Examples of suitable diols HO—R⁷—OH are ethane-1,2-diol, propane-1,2-diol, propane-1,3-diol, butane-1,3- and -1,4-diol, pentane-1,5-diol, but-2-ene-1,4-diol, but-2-yne-1,4-diol, neopentyl glycol, 2-methyl-2-phenylpropane-1,3-diol, pentane-1,5-diol, 3-methyl-pentane-1,5-diol, hexane-1,5-diol, 3-phenoxy-propane-1,2-diol, 3-ethoxy-propane-1,2-diol, diethylene glycol, triethylene glycol, thiodiglycol, dipropylene glycol, dibutylene glycol, hexane-1,6-diol, decane-1,10-diol, dodecane-1,12-diol, 1,4-bis-hydroxymethyl-benzene, 1,4-bis-hydroxymethylcyclohexane and 2-phenoxy-propane-1,3-diol.

Among the radiation-sensitive mixtures, those are very particularly preferred which contain polymeric compounds having units of the formula II in which $R^1$ denotes hydrogen, $R^3$ denotes methyl, ethyl or chloromethyl and $R^7$ denotes an alkylene group which has 2–12 carbon atoms and which can be interrupted by oxygen atoms, cyclohexylene groups or phenylene groups, and m is a number from 5 to 150.

The following are exemplary of triols, on which the units are based: 2-methyl- or 2-ethyl- or 2-chloromethyl-2-hydroxymethyl-4-oxa-hexane-1,6-diol, 2-methyl- or 2-ethyl- or 2-chloromethyl-2-hydroxymethyl-4-oxa-heptane-1,7-diol, 2-methyl- or 2-ethyl- or 2-chloromethyl-2-hydroxymethyl-4-oxa-octane-1,8-diol, 2-ethyl- or 2-chloromethyl-2-hydroxymethyl-5-methyl-4-oxa-heptane-1,7-diol, 2-ethyl- or 2-chloromethyl-2-hydroxymethyl-4-oxa-octane-1,7-diol, 2-methyl- or 2-ethyl-2-hydroxymethyl-4,7-dioxa-nonane-1,9-diol, 2-methyl- or 2-ethyl-2-hydroxymethyl-4,7,10-trioxadodecane-1,12-diol, 1-hydroxymethyl-4-(2-ethyl-3-hydroxy-2-hydroxymethyl)-propoxy-benzene, 2-methyl- or 2-ethyl-2-hydroxymethyl-4-oxa-decane-1,10-diol, 2-methyl- or 2-ethyl-2-hydroxymethyl-4-oxa-undecane-1,11-diol, 2-methyl- or 2-ethyl-2-hydroxymethyl-4-oxa-dodecane-1,6-diol, 2-ethyl-2-hydroxy-methyl-7-methyl-4-oxa-nonane-1,9-diol, 2-ethyl-2-hydroxymethyl-5-methyl-4,7-dioxa-decane-1,9-diol, 2-ethyl-2-hydroxymethyl-5-methyl-4-oxa-nonane-1,8-diol, 2-phenyl-2-hydroxymethyl-4-oxa-octane-1,8-diol, 2,5-dimethyl-2-hydroxymethyl-4-oxa-heptane-1,7-diol, 2-methyl-2-hydroxymethyl-4-oxa-octane-1,7-diol, 2,7-dimethyl-2-hydroxymethyl-4-oxa-nonane-1,9-diol, 2,5-dimethyl-2-hydroxymethyl-4-oxa-decane-1,9-diol, 2,5-dimethyl-2-hydroxymethyl-4-oxa-nonane-1,8-diol, 2-methyl-2-hydroxymethyl-6-ethyl-6-butyl-4-oxa-heptane-1,7-diol, 2,6-diethyl-2-hydroxymethyl-6-butyl-4-oxa-heptane-1,7-diol, 2-methyl- or 2-ethyl-4-oxa-tetradecane-1,14-diol, 2-methyl- or 2-ethyl-4-oxa-hexadecane-1,16-diol, 1-hydroxymethyl-4-(2,2-bis-hydroxymethyl-propoxy)-methyl-cyclohexane or -benzene and 1-hydroxymethyl-4-(2,2-bis-hydroxymethyl-butoxy)-methyl-cyclohexane or -benzene.

Mixed polymers also can be prepared by employing different triols. The reaction of hydroxyl end groups with polyfunctional isocyanates or epoxides makes it possible, if desired, to increase the molecular weight. The molecular structure of the polymeric ortho-esters can be further modified by replacing a small proportion of the triols used by tetraols or by those triols which, compared with the ease of formation of five-membered or six-membered rings, less readily form 1,3-dioxacycloalkanes with the inclusion of an ortho-ester carbon atom. If a certain degree of branching of the polymer molecules is produced in this way, the difference in solubility between exposed and unexposed portions can be increased in a desirable manner. The prerequisite is that the solubility of the branched polymers is still adequate for the preparation of coating solutions in suitable solvents. Suitable triols are, for example, the reaction products of trimethylol-methane or —ethane with ethylene oxide or heptane-1,4,7-triol.

To prepare the positive-working, radiation-sensitive mixtures according to the invention, the polymeric ortho-esters described are mixed with substances which form, or liberate, acids photochemically or by the action of high-energy radiation. The quantitative proportion of the polymeric ortho-esters in the nonvolatile constituents of the total mixture here can be between about 8 and 70, preferably between 14 and 45, percent by weight.

If appropriate, the polymeric ortho-esters also can be mixed with other compounds which can be split by acid, for example mono- or bis-ortho-esters, such as are described in German Auslegeschrift No. 2,610,842, or with polyacetals or polyketals of German Offenlegungsschrift No. 2,718,254; the quantitative proportion indicated then relates to the total amount of substance which can be split by the action of acid.

Preferably, the mixtures also contain a polymeric, preferably water-insoluble binder which is soluble in organic solvents. Because aqueous-alkaline solutions advantageously can be employed as developer liquids for the exposed photosensitive layers and because these are in general preferred to developers based on organic solvents, those binders are particularly preferred which are soluble, or at least swellable, in aqueous alkalies.

The nature and quantity of the water-insoluble binders can differ depending on the intended application; the proportions in total solids are preferably between 30 and 90, particularly preferably 55 to 85, percent by weight.

The phenolic resins, proven in many positive resist materials, above all novolaks, have proved particularly useful and advantageous also in the mixtures according to the invention. They promote the strong differentiation between the exposed and unexposed parts of the layer on development, particularly the more highly condensed resins containing substituted phenols, for example cresols, as the formaldehyde condensation partners. The novolaks also can be modified in a known manner by reacting a part of their hydroxyl groups with, for example, chloroacetic acid, isocyanates, epoxides or carboxylic acid anhydrides. Other alkali-soluble resins, such as copolymers of maleic anhydride and styrene, vinyl acetate and crotonic acid, methyl methacrylate and methacrylic acid, and the like are also suitable as binders.

Additionally, numerous other resins also can be used in the mixtures, which can be either water-soluble or alkali-insoluble; preferably these are vinyl polymers, such as polyvinyl acetates, polyacrylates, polyvinyl ethers and polyvinyl pyrrolidones, which in turn can be modified by comonomers. The most favorable proportion of these resins depends on the requirements of the application and on the influence on the development conditions, and in general it is not more than 20%, relative to the alkali-soluble resin. Furthermore, for special requirements, such as flexibility, adhesion, gloss and the like, the photosensitive layer can also contain small amounts of substances, such as polyglycols, cellulose ethers, for example ethylcellulose, wetting agents, dyestuffs and finely particulate pigments.

As the radiation-sensitive components which, on irradiation, form or liberate preferably strong acids, a large number of known compounds and mixtures, such as diazonium, phosphonium, sulfonium and iodonium salts, halogen compounds, o-quinonediazide-sulfochlorides and organometal-organohalogen combinations, are suitable.

Among diazonium salts, the compounds known for the diazotype process and having a utilizable absorption between 300 and 600 nm can be used. Several proven diazonium compounds, which have adequate storage life according to experience, are mentioned in the examples; those compounds are preferred which do not contain any basic substituents.

The diazonium, phosphonium, sulfonium and iodonium compounds mentioned are as a rule employed in the form of their salts which are soluble in organic solvents, in most cases as a product obtained by precipitation with complex acids, such as tetrafluoroboric acid, hexafluorophosphoric acid, hexafluoroantimonic acid and hexafluoroarsenic acid.

It is also possible, however, to use halides of the positive-working o-quinone diazides. The acidity of the indenecarboxylic acids formed on exposure of o-naphthoquinonediazides is in most cases only just sufficient for an adequate imagewise differentiation. From this group, naphthoquinone-1,2-diazide-(2)-4-sulfochloride is preferred; when this is exposed, three acid groupings are formed, which results in a relatively large intensification factor in the splitting of the polymeric orthoesters.

In principle, all the organic halogen compounds, which are known also as photochemical free radical initiators, for example those having more than one halogen atom on a carbon atom or on an aromatic ring, can be used as the halogen-containing, radiation-sensitive compounds which form a hydrohalic acid. Examples are described in U.S. Pat. Nos. 3,515,552, 3,536,489, and 3,779,778, in German Auslegeschrift No. 2,610,842, and in German Offenlegungsschriften Nos. 2,718,259 and 2,243,621. The activity of these halogen-containing compounds can, also for the positive resist materials according to the invention, be spectrally influenced and enhanced by known sensitizers.

Examples of suitable initiators are: 4-(di-n-propylamino)benzenediazonium tetrafluoborate, 4-p-tolylmercapto-2,5-diethoxybenzenediazonium hexafluorophosphate and tetrafluoborate, diphenylamine-4-diazonium sulfate, 4-methyl-6-trichloromethyl-2-pyrone, 4-(3,4,5-trimethoxy-styryl)-6-trichloromethyl-2-pyrone, 4-(4-methoxy-styryl)-6-(3,3,3-trichloropropenyl)-2-pyrone, 2-trichloromethyl-benzimidazole, 2-tribromomethyl-quinolone, 2,4-dimethyl-1-tribromoacetyl-benzene, 3-nitro-1-tribromoacetylbenzene, 4-dibromoacetyl-benzoic acid, 1,4-bis-dibromomethyl-benzene, tris-dibromomethyl-s-triazine, 2-(6-methoxy-naphth-2-yl)-, 2-(naphth-1-yl)-, 2-(naphth-2-yl)-, 2-(4-ethoxyethyl-naphth-1-yl)-, 2-(benzopyran-3-yl)-, 2-(4-methoxy-anthrac-1-yl)- and 2-(phenanthr-9-yl)-4,6-bis-trichloromethyl-s-triazine and the compounds mentioned in the examples.

The quantity of initiator also can vary widely, depending on its chemical nature and the composition of the mixture. Favorable results are obtained with about 0.1 to 10% by weight, relative to total solids, and 0.2 to 5% are preferred. In particular for photosensitive layers of thicknesses over 10 μm, it is advisable to use relatively little acid donor.

Furthermore, soluble or finely particulate dispersible dyestuffs and, depending on the application, UV absorbers also can be added to the photosensitive mixture. Triphenylmethane dyestuffs, in particular in the form of their carbinol bases, have proved to be particularly suitable dyestuffs. The most advantageous quantity ratios of the components can be readily determined in an individual case by preliminary experiments.

Suitable solvents for the mixture of substances according to the invention are ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl ether, and esters, such as butyl acetate. It is also possible to use mixtures which additionally can contain solvents, such as acetonitrile, dioxane or dimethylformamide, for special purposes. In principle all those solvents can be used which do not irreversibly react with the components of the layer.

The choice of solvents must, however, be matched to the intended coating process, to the layer thickness and to the drying apparatus. Thin layers of up to about 5 μm are applied, for experimental quantities, preferably by spin-coating. Layer thicknesses of more than 60 μm can be obtained in this way, using solutions of up to about 40% solids content in a single application or with a doctor blade or wire bar. For coating on both sides, dip-coating is preferred, rapid initial drying due to the use of low-boiling solvents being an advantage. Web coating is effected by application by means of rollers, slot dies or spraying; single plates, such as zinc plates and multi metal plates, can be coated by means of a curtain coater.

Compared with other positive layers, in particular those based on o-naphthoquinone-diazide, the preparation of relatively thick layers is advantageously possible because the photosensitivity of the mixture according to the invention is relatively little dependent on the thickness. Exposure and processing of layer thicknesses of up to 100 μm and more are possible.

Preferred carriers for layers of more than 10 μm thickness are plastic films which then serve as temporary carriers for transfer layers. For this purpose and for colored films, polyester films are preferred, for example those of polyethylene terephthalate. Polyolefin films, such as polypropylene, are, however, also suitable. As the layer carriers for layer thicknesses of less than about 10 μm, metals are used in most cases. The following can be employed for offset printing plates: mechanically or electrochemically roughened and, if appropriate, anodized aluminum which additionally can be chemically pretreated, for example with polyvinyl phosphonic acid, silicates or phosphates, and moreover multi-metal plates with Cu/Cr or brass/Cr as the top layer. For relief printing plates, the layers according to the invention can be applied to plates of zinc or magnesium or their commercially available microcrystalline alloys for single-stage etching processes, and they also can be applied to plastics which can be chemically etched, such as polyoxymethylene. Due to their good adhesion and resistance to etching on copper or nickel surfaces, the layers according to the invention are suitable for gravure printing plates or screen printing plates. Likewise, the mixtures according to the invention can be used as photoresists and in chemical milling.

Furthermore, the coating can be effected, directly or by dry layer transfer from the temporary support, on printed circuit board materials which consist of insulating plates with a copper overlay on one side or both sides, on glass or on ceramic materials which, if appropriate, have been subjected to an adhesion-promoting pretreatment, and inter alia on silicon, silicon oxide and silicon nitride wafers. Additionally, wood, textiles and surfaces of many materials can be coated, which advantageously are provided with an image by projection and which are resistant to the action of alkaline developers.

The customary apparatus and conditions are acceptable for drying after the coating, and temperatures of about 100° C., and briefly up to 120° C., are tolerated without losses of radiation sensitivity.

The conventional copying apparatus, such as tubular lamps, xenon pulse lamps, metal halide-doped mercury vapor high-pressure lamps and carbon arc lamps can be used for the exposure. Moreover, exposure in customary projectors and enlargers under the light of the metal filament lamps and contact exposure with ordinary incandescent lamps is possible in the case of the photosensitive layers containing polymeric ortho-esters. The exposure can be carried out with the coherent light of a laser. Short-wave lasers of appropriate performance, for example argon lasers, krypton ion lasers, dyestuff lasers and helium/cadmium lasers, which emit between 300 and 600 nm, are suitable for the purposes of the present invention. The laser beam is controlled by means of a preset programmed line motion and/or screen motion.

Irradiation with electron beams is a further possibility of imaging. Electron beams can thoroughly decompose and crosslink the mixture according to the invention, in the same way as many other organic materials, so that a negative image is formed when the unirradiated parts are removed by solvents or by exposure without an original and development. At lower intensity and/or higher writing speed of the electron beam, however, the electron beam effects a differentiation in the direction of higher solubility, i.e., the irradiated parts of the layer can be removed by the developer. It has been found that the layers according to the invention are considerably more sensitive to electron beams than conventional naphthoquinone-diazide layers and—as explained in the examples—a wide band range of comparatively low energy action of electron beams can be exploited. The choice of the most favorable conditions can be readily determined by preliminary experiments.

The layer which has been exposed or irradiated imagewise can be removed with virtually the same developers as those for commercially available naphthoquinonediazide layers and photoresist compositions, or the new layers advantageously can be matched in their copying conditions to the known auxiliaries, such as developers and programmed spray-development installations. The aqueous developer solutions can, for example, contain alkali metal phosphates, alkali metal silicates or alkali metal hydroxides and in addition wetting agents and also relatively small proportions of organic solvents. In certain cases, solvent/water mixtures also can be used as the developer. The selection of the most favorable developer can be made by experiments with the particular layer used. If required, the development can be mechanically assisted. To increase the resistance on printing and the resistance to washing fluids, correcting agents and printing inks which can be cured by UV light, the developed plates can be heated for a short period to elevated temperatures, such as is known from British Pat. No. 1,154,749, for diazotype layers.

According to the invention, a process for the production of relief images is also proposed, in which a radiation-sensitive recording material which is composed of a carrier and a recording layer which contains, as the essential constituents (a) a compound which forms an acid under the action of actinic radiation, and (b) a polymeric compound having recurrent ortho-carboxylic acid ester groupings, which can be split by acid, in the main chain, the solubility of the compound (b) in a liquid developer being increased by the action of acid, is irradiated imagewise with actinic radiation at such a dose that the solubility of the layer in a liquid developer increases, and the irradiated parts of the layer are washed out by means of a liquid developer. The process comprises using a polymeric compound (b) of the general formula I

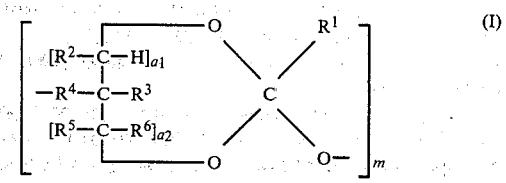

wherein $R^1$ is a hydrogen atom or an alkyl, cycloalkyl or aryl group, $R^2$, $R^3$, and $R^5$ are identical or different and denote hydrogen atoms or alkyl or aryl groups, $R^4$ denotes an alkylene group or —if $a_1=a_2=1$— also an alkyleneoxy group, it being possible for the alkylene groups to be interrupted by hetero-atoms or by unsaturated or cyclic groups, $R^6$ denotes a hydrogen atom or a methyl group, $a_1$ and $a_2$ each denote 0, 1 or 2, $a_1+a_2$ denotes 1 or 2 and m denotes a number from 3 to 200.

If the process is carried out with electron radiation, those acid donors, the absorption regions of which lie in the shorter wavelength part of the electromagnetic spectrum and which are thus less sensitive to daylight, are also suitable in addition to the known photolytic acid donors which are sensitive to visible light and near UV light. This has the advantage that the recording materials can be handled without excluding light and that the materials can be rendered more readily storable.

Examples of starters of this type are tribromomethyl phenyl sulfone, 2,2',4,4',6,6'-hexabromo-diphenylamine, pentabromoethane, 2,3,4,5-tetrachloro-aniline, pentaerythritol tetrabromide, chloroterphenyl resins or chlorinated paraffins.

The compound which forms acid under the action of electron radiation, however, can also be the polymeric orthocarboxylic acid ester itself if it is substituted at a suitable point by halogen atoms, in particular chlorine, bromine or iodine.

The mixtures according to the invention also can be solubilized by means of X-ray radiation.

In the following text, examples of the photosensitive mixtures according to the invention are given. The preparation of a number of new polymeric ortho-esters, which have been tested in mixtures according to the invention as the compounds which can be split by acid, is here described first. They are numbered consecutively as compounds 1 to 16 and recur in the application examples under this designation.

In the examples, parts by weight (pbw) and parts by volume (pbv) have the same relationship as the g to the ml. Percentage data and quantity data are to be understood as units by weight, unless otherwise stated.

GENERAL INSTRUCTIONS FOR THE PREPARATION OF THE POLYMERIC ORTHO-ESTERS, COMPOUNDS 1–15

One mole of the triol

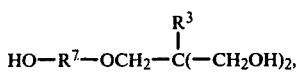
$$HO-R^7-OCH_2-\underset{\underset{\displaystyle CH_2OH)_2,}{|}}{\overset{\overset{\displaystyle R^3}{|}}{C}}$$

1.03 mole of a trimethyl or triethyl ortho-carboxylate, 0.75 g of p-toluenesulfonic acid and 800 ml of toluene are slowly heated to 100° C. with stirring, about 100 g or 150 g of an alcohol/toluene mixture distilling off in the course of 2.5 hours through a Vigreux column placed on top. The temperature is raised to 115° C. and, during the following 3.5 hours, about 200 g of distillate are once more collected. The contents of the flask are stirred with 3 g of potassium carbonate and subsequently filtered.

The analysis of the clear solution, thus obtained, of the polymeric ortho-ester is carried out by evaporating an aliquot part under reduced pressure and heating the residue for one hour at 60° C. and under $10^3$ mbars in a bulb tube apparatus. The molecular weights were determined by vapor pressure osmometry. They represent lower limit values of the number average since even small amounts of residual solvent falsify the value of $\overline{M}_n$ in the direction of lower values. It is indicated in column 2 of Table 1, whether the corresponding trimethyl (M) or triethyl (E) ortho-carboxylate was used for the preparation.

PREPARATION OF THE POLYMERIC ORTHO-ESTER, COMPOUND 16

23.65 g of 1,2,6-hexanetriol, 22.5 g of trimethyl orthoformate and 25 mg of p-toluenesulfonic acid are gradually heated, with stirring and while distilling off methanol, in the course of 5 hours to an end temperature of 160° C. The mixture is diluted with 50 ml of ether, stirred with 0.7 g of potassium carbonate and filtered, and the filtrate is freed from solvent under reduced pressure. This gives 27.8 g of polymeric ortho-ester, the IR absorption spectrum of which does not show any hydroxyl groups and shows only a very small carbonyl content.

EXAMPLES 1 TO 6

Layers which have been applied in a thickness of about 2 μm to (a) mechanically roughened or (b) electrolytically roughened and anodized aluminum and which have a composition of 77 parts by weight of cresol/formaldehyde novolak (melting range 105°–120° C. according to DIN 53,181) and 23 parts by weight of polymeric ortho-ester and which, if appropriate, also contain 4 parts by weight of acid donor and/or 0.6 part by weight of Crystal Violet base, are irradiated with 11 kV electrons. Under the conditions stated in Table 2, the irradiated areas become soluble in the developer of the following composition:

- 5.5 parts by weight of sodium metasilicate·9H$_2$O,
- 3.4 parts by weight of trisodium phosphate·12H$_2$O,
- 0.4 part by weight of anhydrous monosodium phosphate, and
- 90.7 parts by weight of fully deionized water.

The developing time is one minute in all cases.

TABLE 2

| Example No. | Carrier | Acid Donor | Compound No. | Radiation energy dose (Joule/cm$^2$) | Dyestuff |
|---|---|---|---|---|---|
| 1 | a | 2-(4-Ethoxy-naphth-1-yl)-4,6-bis-trichloro-methyl-s-triazine | 2 | 3–140 . 10$^{-2}$ | yes |
| 2 | a | Tris-trichloro-methyl-s-triazine | 7 | 1–90 . 10$^{-2}$ | yes |
| 3 | a | Chloroparaffin resin | 8 | 0.8–90 . 10$^{-2}$ | yes |
| 4 | a | none | 10 | 18–120 . 10$^{-2}$ | no |

TABLE 1

| Compound No. | Ortho-ester used | R$^1$ | R$^3$ | R$^7$ | $\overline{M}_n$ |
|---|---|---|---|---|---|
| 1 | M | H | C$_2$H$_5$ | —(CH$_2$)$_2$— | 1290 |
| 2 | M | H | C$_2$H$_5$ | —(CH$_2$)$_3$— | 1680 |
| 3a+ | M | H | " | —(CH$_2$)$_4$— | 1470 |
| 3b | E | H | " | —(CH$_2$)$_4$— | 1530 |
| 4 | M | H | " | —CH$_2$—CH$_2$—CH(CH$_3$)— or —CH(CH$_3$)—CH$_2$—CH$_2$— | 1110 |
| 5 | M | H | " | —CH$_2$CH$_2$OCH$_2$CH$_2$— | 1540 |
| 6 | M | H | " | —(CH$_2$CH$_2$O)$_2$CH$_2$CH$_2$— | 1630 |
| 7 | M | H | CH$_3$ | —(CH$_2$)$_4$— | 2580 |
| 8 | M | H | CH$_3$ | —(CH$_2$)$_10$— | 1540 |
| 9 | M | H | C$_2$H$_5$ | —CH$_2$—⟨C$_6$H$_{10}$⟩—CH$_2$— | 2420 |
| 10 | M | H | ClCH$_2$ | —(CH$_2$)$_4$— | 1410 |
| 11 | E | CH$_3$ | CH$_3$ | —(CH$_2$)$_4$— | 1370 |
| 12 | E | C$_2$H$_5$ | CH$_3$ | —(CH$_2$)$_4$— | 930 |
| 13 | E | Phenyl | C$_2$H$_5$ | —(CH$_2$)$_4$— | 1240 |
| 14 | M | Cyclohexyl | C$_2$H$_5$ | —(CH$_2$)$_4$— | 1280 |
| 15 | M | H | C$_2$H$_5$ | —CH$_2$—CH=CH—CH$_2$— | 1390 |

+Markedly higher molecular weights were determined by gel permeation chromatography. For compound 3a, in addition to small amounts of lower molecular portions, a distribution between 1,000 and about 20,000 molecular weight units was found with maxima at 4,200, 13,000 and 20,000. The chromatogram was prepared using a model Spectra Physics 8000 chromatograph, having a differential diffractometer as a detector. Separation was made with the aid of four columns, each having a length of 500 mm and a diameter of 8 mm (3 columns Varian G 2000 H, 1 column G 3000 H), filled with crosslinked polystyrene granules. The eluant was tetrahydrofuran. Defined polyethylene glycols having a narrow molecular-weight distribution served as a comparison.

TABLE 2-continued

| Example No. | Carrier | Acid Donor | Compound No. | Radiation energy dose (Joule/cm$^2$) | Dye-stuff |
|---|---|---|---|---|---|
| 5 | b | none | 10 | 36–180 . 10$^{-2}$ | no |
| 6 | a | none | 10 | 70–180 . 10$^{-2}$ | yes |

EXAMPLE 7

For the preparation of a re-enlargement plate, 4.0 parts by weight of the novolak indicated in Example 1, 1.2 parts by weight of compound numbers 11, 12, or 16, and 0.2 part by weight of 2-acenaphth-5-yl-4,6-bis-trichloromethyl-s-triazine are dissolved in 94.6 parts by weight of methyl ethyl ketone and the solution is whirler-coated onto a plate of brushed aluminum.

Exposure for 1.5 minutes is effected using a Leitz Prado projector at f=85 mm; 1:2.5, with a 150 watt lamp through a diapositive at a distance of 65 cm. By immersion into the developer indicated in Example 1, an enlarged positive copy of the black-and-white line image on the diapositive is obtained within 30 seconds, which copy can be inked up with greasy ink and duplicated by printing in a small offset machine.

In place of the compounds numbered 11, 12, or 16, the compounds numbered 1, 13, or 14, can be used with a similar result if the duration of exposure is extended to 2 minutes.

EXAMPLES 8–12

The improved heat stability of the photosensitive compositions according to the invention is demonstrated in these examples by comparison with corresponding photosensitive compositions based on ortho-esters described in German Auslegeschrift No. 2,610,842, namely a bis-ortho-ester having 1,3-dioxanyl units and a polymeric ortho-ester which is already fairly heat-stable and is produced from a tetrol (comparative Examples A and B). A lack of heat stability occasionally manifests itself in a decrease of the resistance to developer, i.e., in inadequate differentiation between exposed and unexposed parts of the layer during the developing process. More frequently, however, the lack of heat stability shows up in a marked increase in the necessary developing time; in extreme cases, the areas struck by the light no longer dissolve in the customarily used developer. Forced exposure to heat is regarded as an accelerated test of storage stability at room temperature or moderately elevated temperture. Aluminum plates having an electrolytically roughened and anodized surface are provided with an approximately 2 μm thick layer of the following composition:

73.5% of novolak according to Example 1,
22.2% of orthoester,
3.7% of the acid donor from Example 1 and
0.6% of Crystal Violet base.

Coating is effected by whirler-coating with a 6% solution in methyl ethyl ketone. The plates are each heated in the drying cabinet to 100° C. for the same length of time, exposed through a test original for 15 seconds under a 5 kW metal halide lamp at a distance of 110 cm and developed with the developer from Example 1.

The change in the required developing times as a function of the duration of the heat exposure is shown in Table 3 which follows.

TABLE 3

| Example | Ortho-Ester | Duration of Development (seconds) after heating for | | | | |
|---|---|---|---|---|---|---|
| | | 0 | 1 | 3 | 5 | 7 (hours) |
| A | Polymeric ortho-ester obtained from dispiro-3,11-dimethoxy-2,4,10,12-tetraoxa-(5,1,5,2)-pentadecan-7-one and triethylene glycol | 30 | 40 | 45 | 60 | 120 |
| B | Bis-(5-ethyl-5-butyl-1,3-dioxanyl) ether of 2-ethyl-2-butyl-1,3-propanediol | 30 | 30 | 120 | 240* | — |
| 8 | Compound No. 2 | 20 | 30 | 30 | 30 | 35 |
| 9 | Compound No. 3 | 20 | 30 | 30 | 30 | 30 |
| 10 | Compound No. 5 | 15 | 20 | 30 | 35 | 45 |
| 11 | Compound No. 7 | 15 | 15 | 15 | 15 | 15 |
| 12 | Compound No. 8 | 40 | 50 | 50 | 50 | 50 |

*Can no longer be developed completely without tone.

EXAMPLE 13

An offset printing plate is prepared in the following manner:

A coating solution of 4.0 parts by weight of novolak according to Example 1, 1.2 parts by weight of compound number 7, 0.2 part by weight of 2-(4-methoxy-naphth-1-yl)-4,6-bis-trichloromethyl-s-triazine, 0.04 part by weight of Crystal Violet base and 94.6 parts by weight of butyl acetate/ethylene glycol monomethyl ether in a volume ratio of 1:1 is whirler-coated onto an electrolytically roughened and anodized aluminum plate to a dry weight of 2.0 g/m$^2$ and the coated plate is exposed imagewise for 15 seconds under the conditions of Example 8, after which a strong blue-violet/blue-green image contrast is visible.

The plate is developed, to give a positive image of the original, by wiping over for 45 seconds with the developer of Example 1.

A printing test with this printing plate is stopped after 100,000 prints of perfect quality. The printing run can be considerably increased by reheating the developed printing plate to about 230°–240° C. Pretreatment of the carrier with polyvinyl phosphoric acid enhances the hydrophilic properties of the nonimage areas.

Similar results are obtained if, instead of Compound No. 7, the same quantity of Compound No. 15 is used.

EXAMPLE 14

In this example, the suitability of different ortho-ester/acid donor combinations as constituents of positive-working resist compositions is demonstrated:

Plates of (a) brushed or (b) electrochemically roughened and anodized aluminum are whirler-coated with a solution of 4.7 parts by weight of novolak according to Example 1, 1.4 parts by weight of polymeric ortho-ester, 0.23 part by weight of acid donor and 0.03 part of weight of Crystal Violet base in 93.4 parts by weight of methyl ethyl ketone, the resulting layer thicknesses, depending on the carrier used, being 1.2 μm for (a) and 1.8 μm for (b). The plates are exposed imagewise using the apparatus indicated in Example 8 and are developed with the dedeveloper of Example 1. In all cases, a positive image of the original is obtained. Information on special conditions is given in Table 4.

TABLE 4

| Example | Compound No. | Acid Donor | Carrier | Exposure Time (seconds) |
|---|---|---|---|---|
| 14 | 3 | 2,5-Diethoxy-4-(p-tolylmercapto)-benzene-diazonium tetrafluoborate | b | 6 |
| 15 | 9 | 2,5-Diethoxy-4-(p-tolylmercapto)-benzene-diazonium hexafluorophosphate | a | 12 |
| 16 | 1 | 2-(Naphth-1-yl)-4,6-bis-trichloromethyl-s-triazine | a | 12 |
| 17 | 2 | Acid donor from Example 1 | b | 8 |
| 18 | 6 | 1,2-Naphthoquinone-2-diazide-4-sulfonic acid chloride | b | 4 |
| 19 | 5 | 2-(4-Methoxystyryl)-4,6-bis-trichloromethyl-s-triazine | b | 15 |
| 20 | 16 | 4-(2-Fur-2yl-vinyl)-6-trichloromethyl-pyr-2-one | a | 15 |

EXAMPLE 21

An aluminum plate of electrolytically roughened and anodized aluminum, pretreated with polyvinyl phosphoric acid, is provided with a 1.8 μm thick layer of 4.7 parts by weight of novolak according to Example 1, 1.4 parts by weight of Compound No. 3a, 0.23 part by weight of acid donor according to Example 7 and 0.01 part by weight of Crystal Violet base. This layer is irradiated imagewise over all the spectral lines with an argon laser of 16 W light power, the laser beam being focussed by means of a lens onto a spot of 20 μm diameter. The sensitivity of the individual combinations is determined by varying the writing speeds. The exposed layer parts are dissolved out within 60 seconds upon treatment with the developer of Example 1. The laser track can be made visible more clearly by inking up of the unirradiated areas with greasy ink. The maximum writing speed is 100 m/second.

EXAMPLE 22

The layer, described in Example 13, on an electrolytically roughened, anodized aluminum support, pretreated with polyvinyl phosphonic acid, is arranged at a distance of 3 cm in front of the emergence window of a Philips fine-structure X-ray generator and exposed to the bremsstrahlung continuum and to the Cu characteristic radiation of a Cu cathode. The irradiation is carried out for 25 minutes at a tube voltage of 50 kV and a current intensity of 40 mA. The irradiated areas are washed out with the developer from Example 1.

EXAMPLE 23

For the production of thick resist layers, a solution is prepared which contains
  35% by weight of ethylene glycol monomethyl ether,
  20% by weight of methyl ethyl ketone,
  20% by weight of the cresol-formaldehyde novolak according to Example 1,
  7.5% by weight of a phenol/formaldehyde novolak having a melting range of 110°-120° C. (according to DIN 53,181),
  7.2% by weight of the polyacetal from isobutyraldehyde and triethylene glycol,
  2.4% by weight of Compound No. 4,
  5.0% by weight of a polyethylene glycol of mean molecular weight 1,800-2,200,
  0.38% by weight of the acid donor according to Example 19,
  0.02% by weight of Crystal Violet base, and
  2.5% by weight of modified silicone glycol (commercially available coating aid).

A biaxially stretched and thermo-fixed, 25 μm thick film of polyethylene terephthalate, which has been pretreated with a solution of trichloroacetic acid and polyvinyl alcohol, is coated with this solution and dried in such a way that a 20 μm thick uniform resist layer is formed thereon. Moreover, this layer is protected against dust and scratches by laminating a polyolefin cover film of 25 μm thickness on top.

For the production of printed circuit boards, this positive dry resist is laminated, after the cover film has been peeled off, in a commercially available laminator onto a cleaned preheated carrier which is composed of an insulating material with a 35 μm thick copper overlay. After cooling, peeling off the carrier film, redrying if necessary, 20 seconds exposure under the original of a circuit diagram with a 5 kW metal halide lamp at a distance of 140 cm and spray-development of the parts of the layer, which have been struck by the light and altered, an imagewise resist layer is obtained.

The developer is composed of 0.8% of Na metasilicate·9H$_2$O, 0.5% and NaOH and 0.8% of n-butanol, dissolved in deionized water, and, depending upon the layer thickness, drying and the desired developing time, it can be still further diluted with water.

The image, produced true to the original, is resistant to the conventional chemical etching conditions during the manufacture of printed circuit boards and is also resistant to electroplating in the manufacture of plated through-hole boards. For the manufacture of gold-plated contacts, the parts of the layer, which have remained unaffected, can be exposed once more, developed and electroplated.

Relatively short exposure times, which are unobtainable with positive layers of the same thickness, based on naphthoquinone-diazides, are possible with this layer in spite of its thickness which can even be doubled by laminating twice. After the required customary processing steps, the resist can be readily delaminated, if required, with solvents, such as acetone, or advantageously with aqueous-alkaline strippers, for example 5% sodium hydroxide solution.

The same resist coating solution also can be used for the production of electroplated rotary nickel cylinders for textile screen printing. For this purpose, a nickel cylinder, which is provided in the customary manner with an electrically conductive separating layer, is coated to a thickness of at least 30 μm. Coating is effected by spraying with a spray gun operated with compressed air, the concentration of the solution, the size and shape of the jet and the speed of rotation and advance being matched to one another. All-round exposure is carried out under a line original or a halftone positive original and development is carried out by pouring and spraying as above. The printing plate is then built up by electroplating in such a way that, during the subsequent nickel plating, a nickel skin which becomes increasingly thicker is formed around the imagewise remains of the layer, which have remained unaltered. When the most advantageous thickness has been reached, the round stencil thus formed is axially drawn off from the plate cylinder and made ready for printing.

It will be obvious to those skilled in the art that many modifications may be made within the scope of the present invention without departing from the spirit thereof, and the invention includes all such modifications.

What is claimed is:

1. A radiation-sensitive mixture which comprises (a) a compound which forms an acid under the action of actinic radiation, and (b) a polymeric compound having recurrent ortho-carboxylic acid ester groupings, which can be split by acid, in the main chain, the solubility of the compound (b) in a liquid developer being increased by the action of acid, and said compound (b) being built up from recurrent units of the general formula I:

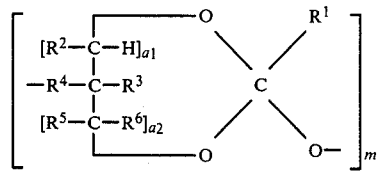 (I)

wherein $R^1$ is a hydrogen atom or an alkyl, cycloalkyl or aryl group, $R^2$, $R^3$, and $R^5$ are identical or different and denote hydrogen atoms or alkyl or aryl groups, $R^4$ denotes an alkylene group or—if $a_1 = a_2 = 1$—also an alkyleneoxy group, it being possible for the alkylene groups to be interrupted by hetero-atoms or by unsaturated or cylic groups, $R^6$ denotes a hydrogen atom or a methyl group, $a_1$ and $a_2$ each denote 0, 1 or 2, $a_1 + a_2$ denotes 1 or 2 and m denotes a number from 3 to 200.

2. A radiation-sensitive mixture as claimed in claim 1 which contains a compound according to Formula I, wherein $R^3$ denotes a hydrogen atom or an alkyl group having 1 to 6 carbon atoms, $R^4$ denotes an alkyleneoxymethyl group having 3 to 13 carbon atoms, wherein the alkylene group can be interrupted by oxygen atoms or cycloalkyl groups, and $R^2$, $R^5$, and $R^6$ denote hydrogen atoms, with $a_1 = a_2 = 1$.

3. A radiation-sensitive mixture as claimed in claim 1 which contains a compound according to Formula I, wherein $R^1$ is a hydrogen atom.

4. A radiation-sensitive mixture as claimed in claim 1 which contains a compound according to Formula I, wherein m denotes a number from 5 to 150.

5. A radiation-sensitive mixture as claimed in claim 1 which additionally contains a polymeric binder which is insoluble in water and soluble in aqueous-alkaline solutions.

6. A radiation-sensitive mixture as claimed in claim 5 which contains 30 to 90% by weight of a polymeric binder, 8 to 69.9% by weight of a compound (b) which can be split by acid, and 0.1 to 10% by weight of an acid-forming compound (a).

7. A process for the production of relief images which comprises imagewise irradiating, with actinic radiation, a radiation-sensitive recording material composed of a layer support and a recording layer which contains (a) a compound which forms an acid under the action of actinic radiation, and (b) a polymeric compound having recurrent ortho-carboxylic acid ester groupings, which can be split by acid, in the main chain, the solubility of compound (b) in a liquid developer being increased by the action of acid, said irradiation being at such a dose that the solubility of the recording layer in a liquid developer increases, and washing out the irradiated parts of the layer with liquid developer, said compound (b) having the general formula I

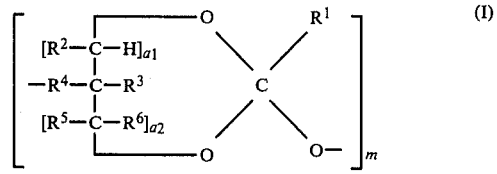 (I)

wherein $R^1$ is a hydrogen atom or an alkyl, cycloalkyl or aryl group, $R^2$, $R^3$, and $R^5$ are identical or different and denote hydrogen atoms or alkyl or aryl groups, $R^4$ denotes an alkylene group or—if $a_1 = a_2 = 1$—also an alkyleneoxy group, it being possible for the alkylene groups to be interrupted by heteroatoms or by unsaturated or cyclic groups, $R^6$ denotes a hydrogen atom or a methyl group, $a_1$ and $a_2$ each denote 0, 1 or 2, $a_1 + a_2$ denotes 1 or 2 and m denotes a number from 3 to 200.

* * * * *